(12) United States Patent
Kofuji et al.

(10) Patent No.: US 8,791,027 B2
(45) Date of Patent: Jul. 29, 2014

(54) METHOD OF MANUFACTURING SEMICONDUCTOR DEVICE

(75) Inventors: Naoyuki Kofuji, Tama (JP); Hideo Miura, Sendai (JP)

(73) Assignee: Hitachi, Ltd., Tokyo (JP)

( * ) Notice: Subject to any disclaimer, the term of this patent is extended or adjusted under 35 U.S.C. 154(b) by 262 days.

(21) Appl. No.: 12/794,606

(22) Filed: Jun. 4, 2010

(65) Prior Publication Data

US 2010/0311246 A1    Dec. 9, 2010

(30) Foreign Application Priority Data

Jun. 4, 2009   (JP) ................................ 2009-134608

(51) Int. Cl.
*H01L 21/302* (2006.01)

(52) U.S. Cl.
USPC .............. 438/736; 438/714; 438/735; 216/49

(58) Field of Classification Search
USPC ......... 438/706, 710, 712, 714, 720, 723, 735, 438/725, 736; 216/41, 47, 49; 430/310, 430/312, 313
See application file for complete search history.

(56) References Cited

U.S. PATENT DOCUMENTS

| 6,841,484 B2 | 1/2005 | Ying et al. | |
| 6,942,816 B2 | 9/2005 | Rusu et al. | |
| 7,037,850 B2 * | 5/2006 | Lee et al. | 438/725 |
| 7,670,759 B2 | 3/2010 | Morioka | |
| 7,728,252 B2 | 6/2010 | Morikawa et al. | |
| 2002/0182881 A1 * | 12/2002 | Ni et al. | 438/725 |
| 2004/0171211 A1 * | 9/2004 | Lee et al. | 438/243 |
| 2004/0217086 A1 | 11/2004 | Kawashima | |
| 2007/0141764 A1 * | 6/2007 | Soda | 438/151 |
| 2007/0167002 A1 * | 7/2007 | Lee et al. | 438/637 |
| 2007/0199657 A1 | 8/2007 | Kofuji et al. | |
| 2008/0078505 A1 | 4/2008 | Kofuji et al. | |

FOREIGN PATENT DOCUMENTS

| JP | 2004-103925 A | 4/2004 |
| JP | 2007-287924 A | 11/2007 |
| JP | 2008-205183 A | 9/2008 |
| WO | WO 2006/003962 A1 | 1/2006 |

OTHER PUBLICATIONS

Office Action issued Nov. 6, 2012, corresponding Japanese Patent Application No. 2009-134608.

* cited by examiner

*Primary Examiner* — Lan Vinh
(74) *Attorney, Agent, or Firm* — Miles & Stockbridge P.C.

(57) ABSTRACT

A problem of a resist mask collapse due to a plasma process is solved. In a method of manufacturing a semiconductor device including steps of a plasma process to a sample having a mask made of an organic material, the plasma process includes a first step of a plasma process under a gas containing any of fluorine, oxygen, or nitrogen, or containing all of them, and a second step of the plasma process under a gas containing a rare gas without containing any of fluorine, oxygen, and nitrogen, and the first step and the second step are repeated.

8 Claims, 15 Drawing Sheets

FILM FORMATION

LITHOGRAPHY

BARC ETCHING (O₂ PLASMA)

HARDMASK ETCHING (F PLASMA)

GATE ETCHING

SIDE SURFACE A    SIDE SURFACE B

LARGE STRESS    SMALL STRESS

ASPECT 1.0

ASPECT 2.0

ASPECT 3.5

COLLAPSE ANGLE 41°

FIG. 14

TABLE 1

| STEP | TIME | GAS (sccm) | | PRESSURE | μ WAVE POWER | WAFER BIAS | WAFER TEMPERATURE |
|---|---|---|---|---|---|---|---|
| | s | Ar | O2 | Pa | kW | kW | °C |
| 1 | 20 | 20~800 | 2~80 | 0.3~2.0 | 0.2~2.0 | 0.0~1.0 | 0~60 |

TABLE 2

| STEP | TIME | GAS (sccm) | | PRESSURE | μ WAVE POWER | WAFER BIAS | WAFER TEMPERATURE |
|---|---|---|---|---|---|---|---|
| | s | Ar | O2 | Pa | kW | kW | °C |
| 1 | 30 | 20~800 | 2~80 | 0.3~2.0 | 0.2~2.0 | 0.0~1.0 | 0~60 |
| 2 | 10 | 22~880 | 0 | 0.3~2.0 | 0.2~2.0 | 0.0~1.0 | 0~60 |

TABLE 3

| STEP | TIME | GAS (sccm) | | PRESSURE | μ WAVE POWER | WAFER BIAS | WAFER TEMPERATURE |
|---|---|---|---|---|---|---|---|
| | s | Ar | O2 | Pa | kW | kW | °C |
| 1 | 15 | 20~800 | 2~80 | 0.3~2.0 | 0.2~2.0 | 0.0~1.0 | 0~60 |
| 2 | 5 | 22~880 | 0 | 0.3~2.0 | 0.2~2.0 | 0.0~1.0 | 0~60 |
| 3 | 15 | 20~800 | 2~80 | 0.3~2.0 | 0.2~2.0 | 0.0~1.0 | 0~60 |
| 4 | 5 | 22~880 | 0 | 0.3~2.0 | 0.2~2.0 | 0.0~1.0 | 0~60 |

FIG. 15

TABLE 4

| STEP | TIME | GAS (sccm) | | PRESSURE | μ WAVE POWER | ... | MASK | | |
|---|---|---|---|---|---|---|---|---|---|
| | | | | | | | WIDTH | HEIGHT | MECHANICAL STRENGTH |
| | s | Ar | O2 | Pa | kW | ... | nm | nm | GPa |
| 1 | 20 | 60 | 4 | 0.3 | 0.8 | ... | 40 | 220 | 0.4 |

TABLE 5

| STEP | TIME | GAS (sccm) | | PRESSURE | μ WAVE POWER | ... | WAFER TEMPERATURE |
|---|---|---|---|---|---|---|---|
| | s | Ar | O2 | Pa | kW | ... | °C |
| 1 | 15 | 60 | 4 | 0.3 | 0.8 | ... | 50 |
| 2 | 5 | 64 | 0 | 0.3 | 0.8 | ... | 50 |
| 3 | 15 | 60 | 4 | 0.3 | 0.8 | ... | 50 |
| 4 | 5 | 64 | 0 | 0.3 | 0.8 | ... | 50 |

METHOD OF MANUFACTURING SEMICONDUCTOR DEVICE

CROSS-REFERENCE TO RELATED APPLICATION

The present application claims priority from Japanese Patent Application No. 2009-134608 filed on Jun. 4, 2009, the content of which is hereby incorporated by reference into this application.

TECHNICAL FIELD OF THE INVENTION

The present invention relates to a method of manufacturing a semiconductor device. More particularly, the present invention relates to a method of preventing a mask collapse in plasma etching to an etched film with using a mask made of an organic material.

BACKGROUND OF THE INVENTION

U.S. Pat. No. 7,670,759 (Patent Document 1) discloses a method of processing a hardmask and a gate electrode after shrinking a resist pattern by etching. The method is described in detail with reference to FIGS. 2A to 2E. First, in a first step of the method, silicon oxynitride 2, polycrystalline silicon 3, a silicon oxide film 4, an organic antireflection film 5, and a resist film 6 are formed on a silicon substrate 1 (FIG. 2A). Next, in a second step, a resist mask 7 having a line and space (L&S) pattern is formed by exposure and development (FIG. 2B). Next, in a third step, a L&S pattern 48 is formed by etching the organic antireflection film 5 based on the resist mask 7 with plasma under a $O_2$-containing gas (FIG. 2C). At this time, the resist mask is shrunk by O (oxygen) radical, and therefore, an effect capable of forming a mask having a finer dimension than that of the resist mask formed by the exposure and development is obtained. Next, in a fourth step, a hardmask 44 is formed by etching the silicon oxide film 4 with plasma under a $CF_4$ gas with using the pattern 48 as a mask (FIG. 2D). Last, in a fifth step, a gate electrode 43 is formed by etching the polycrystalline silicon 3 with using the hardmask 44 as a mask (FIG. 2E). Also, Patent Document 1 discloses a method of preventing deformation and collapse of the resist mask 7 by adding a sulfur (S)-containing gas in the third step to form a polymer to be a passivation film on a side surface of the resist mask 7.

Further, as a method of preventing deformation and collapse of a resist, U.S. Pat. No. 6,942,816 (Patent Document 2) discloses a method of using Xe (xenon) as a gas for diluting a reactive gas such as oxygen or fluorocarbon.

Still further, although not directly relating to deformation and collapse of a resist, U.S. Pat. No. 6,841,484 (Patent Document 3) discloses a method of, when an electrode material of a multi-layered film used for an MRAM is etched by using a hardmask formed by a resist mask, removing a deposition on a side surface of a metal film by etching a top electrode layer under a fluorine-containing gas, and then, repeating to alternately supply a chlorine-containing gas and a rare gas to each layer of the electrode material on a bottom layer.

SUMMARY OF THE INVENTION

The present invention is for a method of preventing deformation and collapse of a resist mask suitable for a practical device structure. In the practical device structure, as illustrated in FIG. 3A, distances of right and left resist masks adjacent to each other are different from each other. Therefore, for example, when the passivation film 49 is formed on the side surface of the resist mask 7 with using a sulfur-containing gas as disclosed in Patent Document 1, a thick passivation film is formed on a wide distance side "A", and on the other hand, only a thin passivation film is formed on a narrow distance side "B" (FIG. 3B). Since stronger tensile stress is caused on the thick passivation film side than the thin side, there arises a problem of deforming the resist mask 7 on the wide distance side A.

Still further, in the method disclosed in Patent Document 2, when a reactive gas is diluted down to a level of not causing the deformation and collapse of the resist mask 7, there arise a problem of drastically decreasing an etching speed to an etched material by the reactive gas and a selectivity of the mask and a problem of insufficiently shrinking the resist mask.

Still further, in Patent Document 3, a resist mask has a small aspect ratio (horizontal to vertical ratio), so that a problem does not arise. However, when a miniaturized resist mask having a high aspect ratio is used, there arises a problem of causing the deformation and collapse of the resist mask during etching the top electrode, and which resulting in not obtaining a desired shape in a subsequent etching shape.

The inventors have studied on a cause of the deformation and collapse of the resist mask during the plasma process. As a result, a mechanism as illustrated in FIGS. 4A to 4C has been found out. As illustrated in FIG. 4B, it has been found out that, when the plasma process is performed with using a reactive radical such as O (oxygen) radical, degraded layers 50 and 51 made of graphite carbon as a main component are formed on a surface of the resist. Also, it has been found out as well that these degraded layers have strong tensile stresses. Therefore, it has been found out that, for example, when the distances of the right and left resist masks are different from each other as illustrated in FIG. 4A, a thick degraded layer is formed on the wide distance side surface A and a thin degraded layer is formed on the narrow distance side surface B, and therefore, the resist mask is collapsed by the strong tensile stress caused on the thick degraded layer side surface A.

Also, when right and left spaces between the resist mask patterns are widely opened as illustrated in FIG. 5A, if the O radical density in the plasma is not uniformed as illustrated in FIG. 5B, a thick degraded layer is formed on a high O radical density side and a thin degraded layer is formed on a low O radical density side. Therefore, as illustrated in FIG. 5C, it has been found out that the resist is collapsed toward the thick degraded layer side. It has been also found out that F (fluorine) or N (nitrogen) can be also used as the reactive radical generating the same degraded layer.

Based on the above-described mechanism, the inventors have studied on a method of relaxing the stress of the degraded layer as a method of preventing the resist collapse. As a result, it has been found out that a radical generated from a rare gas such as He, Ar, Kr, Xe has a function of relaxing the stress of the degraded layer. Also, they have studied on a timing for the stress relax as well, and as a result, it has been found out that the stress relax is required before the stress becomes larger than a mechanical strength of the resist material. The timing is 15 seconds in a 100 nm line and space pattern. In a future, when the pattern dimension becomes 100 nm or smaller in accordance with miniaturizing a semiconductor device, the timing becomes shorter than 15 seconds. Also, it has been found out that 2 seconds or longer is required for switching the reactive gas and the gas for the stress relax.

From the above-described results, it has been found out that, in order to prevent the resist mask collapse, the plasma process under the gas containing F, O, or N are divided into a plurality of steps to set a process time of each step to 2 seconds or longer and 15 seconds or shorter, and further, to perform the stress relax process with the rare gas plasma for 2 seconds or longer among each of the steps.

More specifically, the processes are settled by the following method.

First, in a method of manufacturing a semiconductor device including steps of a plasma process to a sample having a mask made of an organic material, the plasma process includes: a first step of a plasma process under a gas containing fluorine, oxygen, or nitrogen, or containing all of them; and a second step of a plasma process under a gas containing a rare gas without containing any of fluorine, oxygen, and nitrogen, and the first step and the second step are repeated.

Further, in the method of manufacturing the semiconductor device, time for the first step is 2 seconds or longer and 15 seconds or shorter.

Still further, in the method of manufacturing the semiconductor device, a last step of the plasma process is the second step.

Still further, in the method of manufacturing the semiconductor device, a material of the mask is a photoresist.

Still further, in the method of manufacturing the semiconductor device, an aspect ratio (height/width) of the mask is 2 or larger, and a pattern dimension is 100 nm or smaller.

Still further, in a method of manufacturing a semiconductor device including steps of a plasma process to a sample having a mask made of an organic material, the plasma process includes: a first step of generating stress to an organic film; and a second step of relaxing the stress, and the first step and the second step are alternately repeated.

Still further, in the method of manufacturing the semiconductor device, time for the first step is 2 seconds or longer and 15 seconds or shorter.

Still further, in the method of manufacturing the semiconductor device, a last step of the plasma process is the second step.

Still further, in the method of manufacturing the semiconductor device, a material of the mask is a photoresist.

Still further, in the method of manufacturing the semiconductor device, an aspect ratio (height/width) of the mask is 2 or larger, and a pattern dimension is 100 nm or smaller.

A resist mask collapse due to a plasma process under a gas containing F, O, or N can be prevented.

BRIEF DESCRIPTIONS OF THE DRAWINGS

FIG. 14 illustrates various process conditions (Tables 1, 2, and 3); and

FIG. 15 illustrates various process conditions (Tables 4 and 5).

DESCRIPTIONS OF THE PREFERRED EMBODIMENTS

First Embodiment

Figure 6:
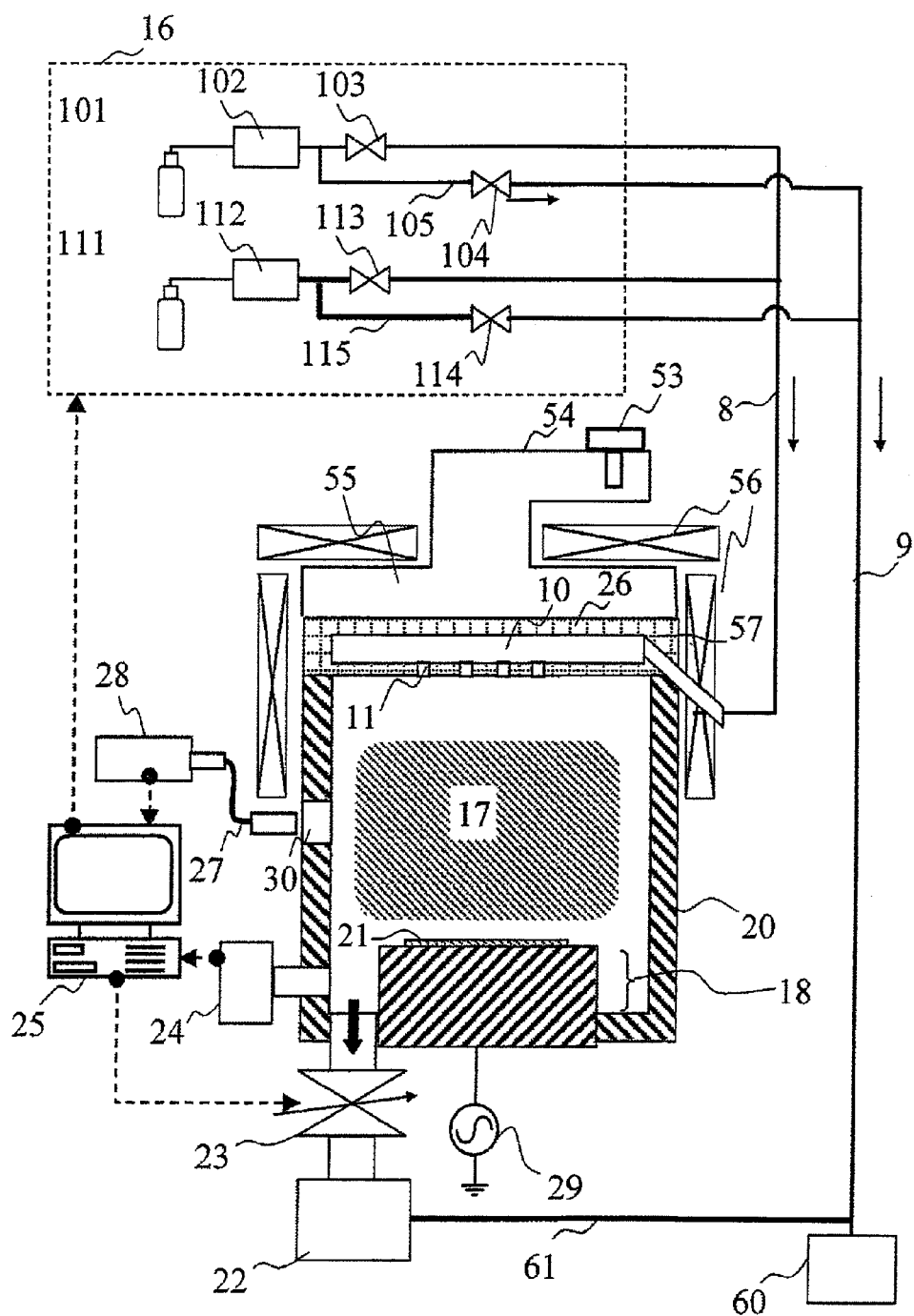
FIG. 6 illustrates microwave plasma etching equipment used in a first embodiment.

In the present embodiment, for rapidly switching gases, equipment having a structure illustrated in FIG. 6 is used.

In the equipment illustrated in FIG. 6, a process gas is supplied from a gas supply unit 16 through a process-gas line 8 and a gas reservoir 10 formed inside a dielectric window 26 made of quartz, and is introduced from a plurality of holes 11 (shower plate structure) provided on a vacuum process chamber side in the dielectric window 26 to the vacuum process chamber. Also, the equipment has a structure that microwaves generated in a magnetron 53 are supplied through a waveguide tube 54, a cavity resonator 55, and the dielectric window 26 to the vacuum process chamber, and plasma 17 is generated by interaction of the microwaves with magnetic field generated by a coil 56.

The plasma 17 is irradiated to a wafer 21 placed on a wafer stage 18, so that the wafer is processed. A RF power supply 29 is connected to the wafer stage 18, and the wafer 21 can be sufficiently processed by applying, for example, RF power of 13.56 MHz. Also, a pressure in the vacuum process chamber 20 can be adjusted by a turbo-molecular pump 22 and a variable valve for the pressure control 23. The pressure is measured by a capacitance manometer 24 attached above the variable valve 23, and a value of the pressure is fed back to control an opening degree of the variable valve 23, so that the pressure can be maintained at a desired value.

A quartz window 30 is provided on a side surface of the process chamber, and is connected to a spectroscopic system 28 through an optical fiber 27 to analyze plasma emission, so that the timing for switching conditions is determined. Based on an instruction of switching conditions from the spectroscopic system 28, a computer 25 instructs a next condition to each unit of the equipment such as the gas supply unit 16.

Inside the gas supply unit 16, $O_2$ gas 101 and Ar gas 111 are connected to the process gas line 8 through MFCs 102 and 112 and valves 103 and 113.

Further, gas lines for exhaust 105 and 115 are provided between the MFCs 102 and 112 and valves 103 and 113, respectively, and are connected to an exhaust gas line 9 through valves 104 and 114, respectively. The exhaust gas line 9 is connected to a pipe 61 connecting between the turbo-molecular pump (exhaust means) 22 and a dry pump 60 for a back-pressure exhaust of the turbo-molecular pump 22.

In the equipment, an operation of switching the process gases from a mixture gas of the $O_2$ gas 101 and the Ar gas 111 to the single Ar gas 111 is described. In a step of the mixture gas of the $O_2$ gas 101 and the Ar gas 111, the valves 104 and 114 connected to the exhaust gas line 9 are closed and the valves 103 and 113 attached to the process gas line 8 are opened, so that the gases each having a desired flow are supplied from the MFCs 102 and 112 to the vacuum process chamber 20. In switching to a step of only the gas 111, the valve 104 is opened and the valve 103 is closed. In this manner, the $O_2$ gas 101 is not flown in the process chamber, and only the Ar gas 111 is supplied to the process chamber. Next, in switching again to the step of the mixture gas of the $O_2$ gas 101 and the Ar gas 111, the valve 103 is opened and the valve 104 is closed. By repeating such processes, the step of the mixture gas of the $O_2$ gas and the Ar gas and the step of the single Ar gas can be rapidly switched.

Figure 7A:
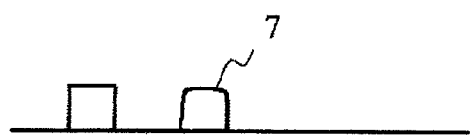
FIG. 7A illustrates an influence of a mask aspect ratio with respect to a mask collapse.
Figure 7B:
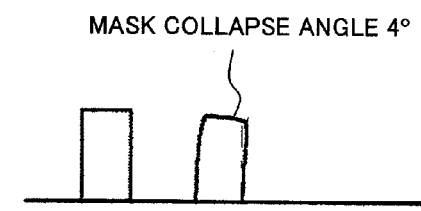
FIG. 7B illustrates an influence of another mask aspect ratio with respect to a mask collapse.
Figure 7C:
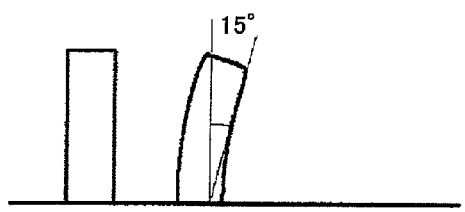
FIG. 7C illustrates an influence of still another mask aspect ratio with respect to a mask collapse.
Figure 8:
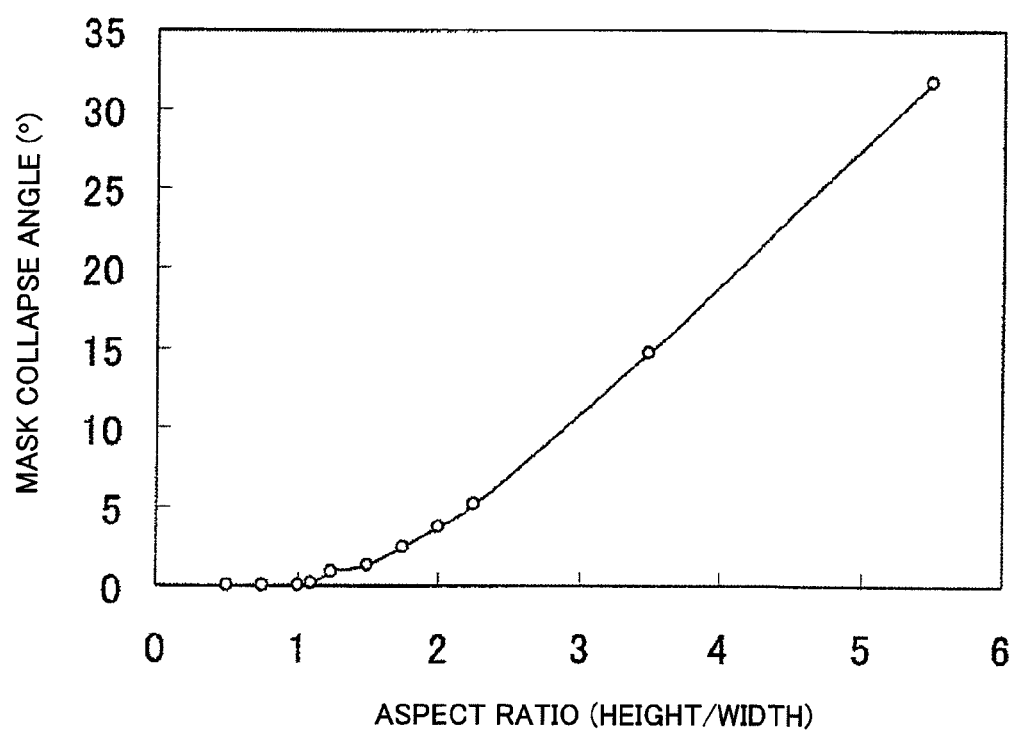
FIG. 8 illustrates a relation between the aspect ratio and the mask collapse.

First, resist mask shrinks have been performed by processing resist masks having various heights for 20 seconds with the plasma under the mixture gas of the $O_2$ gas and the Ar gas in this equipment under a process condition of Table 1. Examples of processed shapes at this time are illustrated in FIGS. 7A to 7C. It has been found out that, while a resist mask collapse is hardly caused in a pattern having an aspect ratio of 1.0 as illustrated in FIG. 7A, a resist mask in the most peripheral line and space pattern is collapsed rightward by an angle of 15 degrees in a pattern having an aspect ratio of 2.0 as illustrated in FIG. 7B and a pattern having an aspect ratio of 3.5 as illustrated in FIG. 7C. A relation between the collapse angle of the mask and the aspect ratio is illustrated in FIG. 8. It has been found out that, while the mask collapse is not caused in the aspect ratio of 1.0 or smaller, the collapse is drastically increased in the aspect ratio of 1.0 or larger. That is, it has been found out that a problem of the mask collapse arises in the mask having the aspect ratio of 1.0 or larger.

In order to solve the problem of the mask collapse, a method of preventing the mask collapse by the resist shrinking with the plasma process under the mixture gas of $O_2$ and Ar, and then, the stress relax process with a plasma under a rare gas has been attempted.

Figure 9:
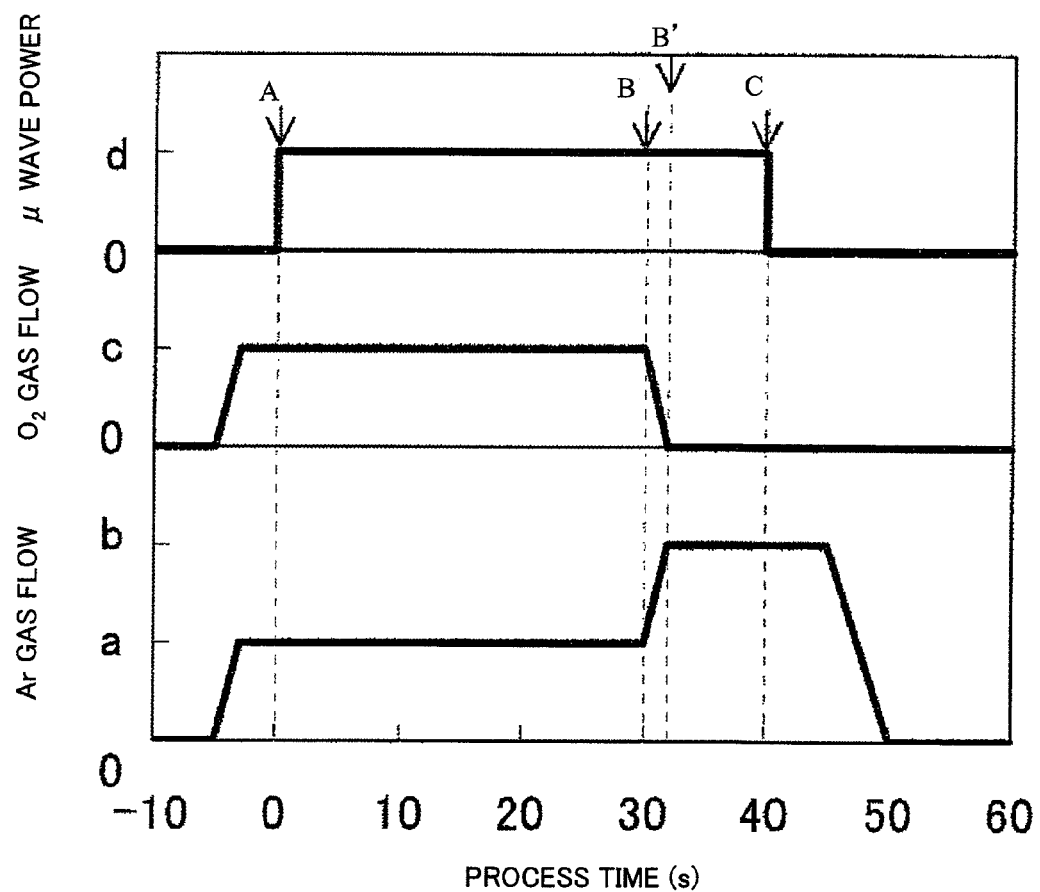
FIG. 9 illustrates a time chart in shrinking a resist and removing a degraded layer.
Figure 10A:
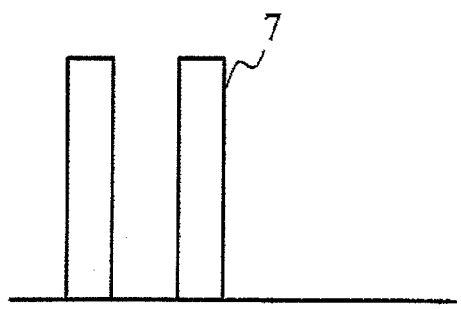
FIG. 10A illustrates time change of a resist mask shape in the time chart of FIG. 9.

With using a resist mask sample of a 100 nm line and space pattern having an aspect ratio of 5.5 as illustrated in FIG. 10A as a sample for the method, the shrink process of the resist mask is performed. First, as shown in a condition of Table 2, the shrink process is continuously performed with the plasma under the mixture gas of $O_2$ and Ar for 30 seconds in a step 1, and then, the stress relax process is performed with the plasma under the single Ar gas for 5 seconds in a step 2. Time changes of the microwave power and the gas flows during the processes are illustrated in FIG. 9. First, in 5 seconds prior to starting the step 1, the $O_2$ and Ar gases each having the desired flow are flown. Next, at a timing "A" when the step 1 is started, the plasma is generated by supplying the microwave power to start the shrink process. Subsequently, at a timing "B" when the step 2 is started, the $O_2$ gas is stopped, and the Ar gas flow is increased at the same time, so that the process is switched to the process of only the Ar gas. Note that the $O_2$ gas flow is not decreased to 0 for about 2 seconds even after the timing B, and therefore, the stress relax process is practically started at a timing "B'" when the $O_2$ gas flow becomes 0 sccm. Last, at a timing "C" when the step 2 is finished, the microwave power is turned to 0 W to turn the plasma discharge off, so that the stress relax process is finished.

Figure 10B:
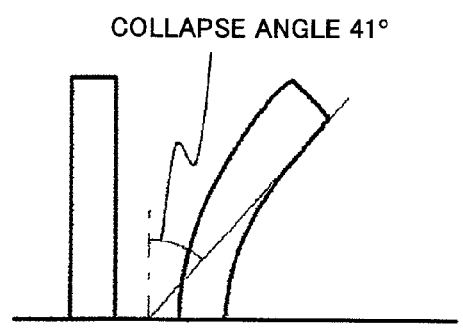
FIG. 10B illustrates time change of the resist mask shape in the time chart of FIG. 9.
Figure 10C:
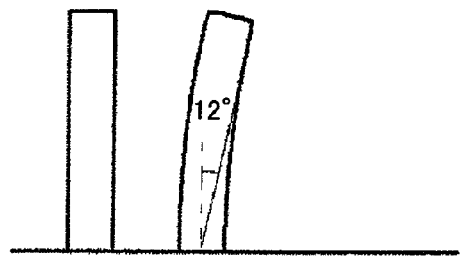
FIG. 10C illustrates time change of the resist mask shape in the time chart of FIG. 9.

In the sequential processes, it has been found out that, in a resist shape at the timing B' when the shrink process is finished, the most peripheral line and space pattern is largely tilted rightward as illustrated in FIG. 10B. Also, in a resist shape at the timing C when the stress relax process is finished, its collapse is reduced but not returned to be vertical to remain a tilt with a collapse angle of 12 degrees as illustrated in FIG. 10C. In this manner, by the step 1 and the step 2, the collapse angle can be at a small degree.

Figure 11:
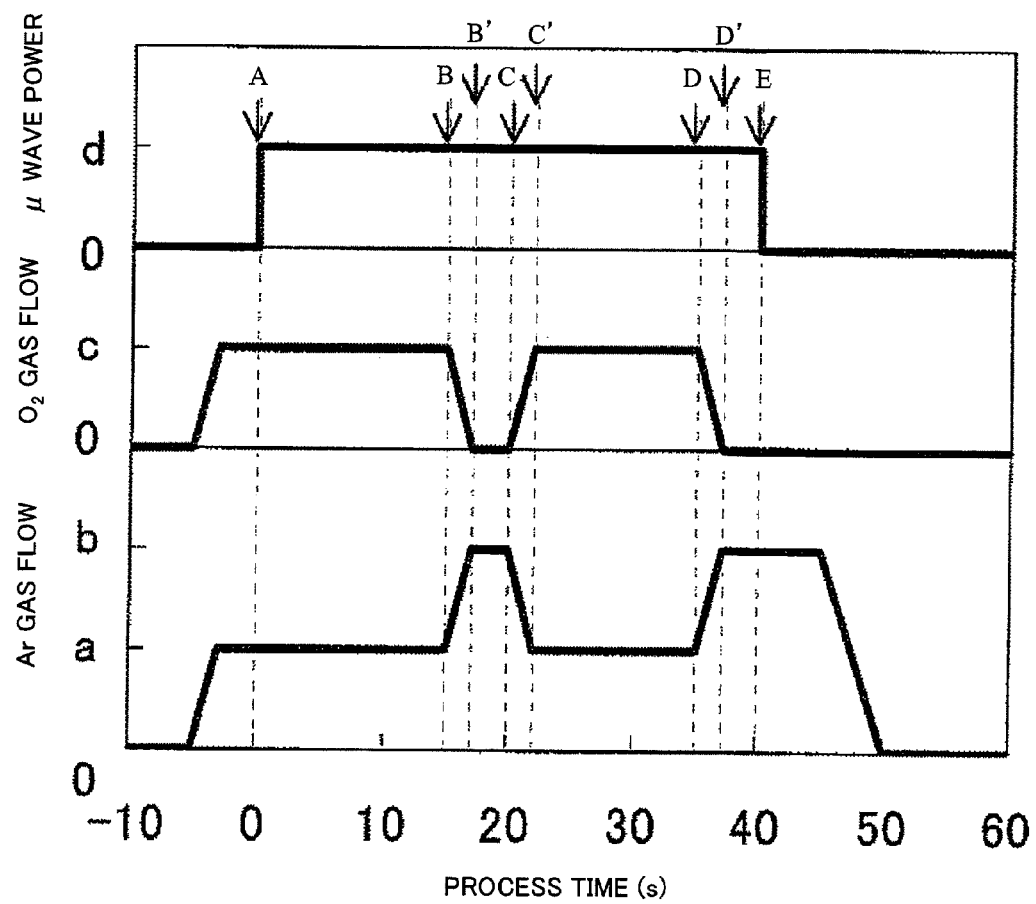
FIG. 11 illustrates a time chart in shrinking a resist and removing a degraded layer according to the present invention.
Figure 12B:
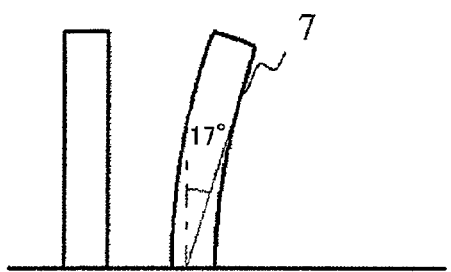
FIG. 12B illustrates time change of a resist mask shape in the time chart of FIG. 11.
Figure 12C:
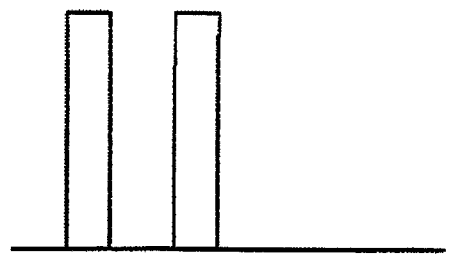
FIG. 12C illustrates time change of the resist mask shape in the time chart of FIG. 11.
Figure 12D:
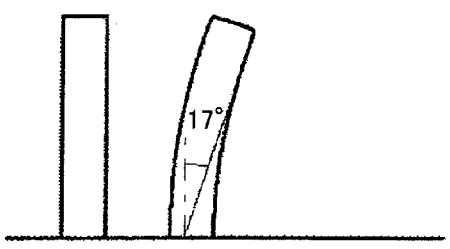
FIG. 12D illustrates time change of the resist mask shape in the time chart of FIG. 11.
Figure 12E:
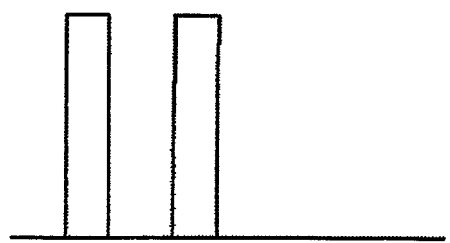
FIG. 12E illustrates time change of the resist mask shape in the time chart of FIG. 11.

Next, as shown in a condition of Table 3, the shrink process for 15 seconds and the stress relax process for 5 seconds are alternately performed each two times. Time changes of the microwave power and the gas flows during the processes are illustrated in FIG. 11. First, in 5 seconds prior to starting the step 1, the $O_2$ and Ar gases each having the desired flow are flown. Next, at a timing "A" when the step 1 is started, the plasma is generated by supplying the microwave power to start the shrink process with the plasma under the mixture gas of $O_2$ and Ar. Subsequently, at a timing "B" when the step 2 is started, the $O_2$ gas is stopped, and the Ar gas flow is increased at the same time, so that the process is switched to the process of only the Ar gas to start the stress relax process. Also in this case, the stress relax process is practically started at a timing "B'" when the $O_2$ gas flow becomes 0 sccm. Next, at a timing "C" when the step 2 is finished, the $O_2$ gas is flown again, and the Ar gas flow is decreased at the same time, so that the shrink process with the plasma under the mixture gas of $O_2$ and Ar is started again. In this case, the shrink process itself is started since $O_2$ is started to be flown at the timing C. However, about 2 seconds are required to reach the desired value of the $O_2$ gas flow, and therefore, a stable shrink process is performed after a timing "C'" when the $O_2$ gas flow reaches a steady-state value. Next, at a timing "D" when a step 3 is finished, the $O_2$ gas is stopped, and the Ar gas flow is increased at the same time, so that the process is switched to the process of only the Ar gas. Also in this case, the stress relax process is practically started at a timing "D'". Last, at a timing when a step 4 is finished, the microwave power is turned to 0 W to turn the plasma discharge off, so that the stress relax process is finished.

Figure 1:
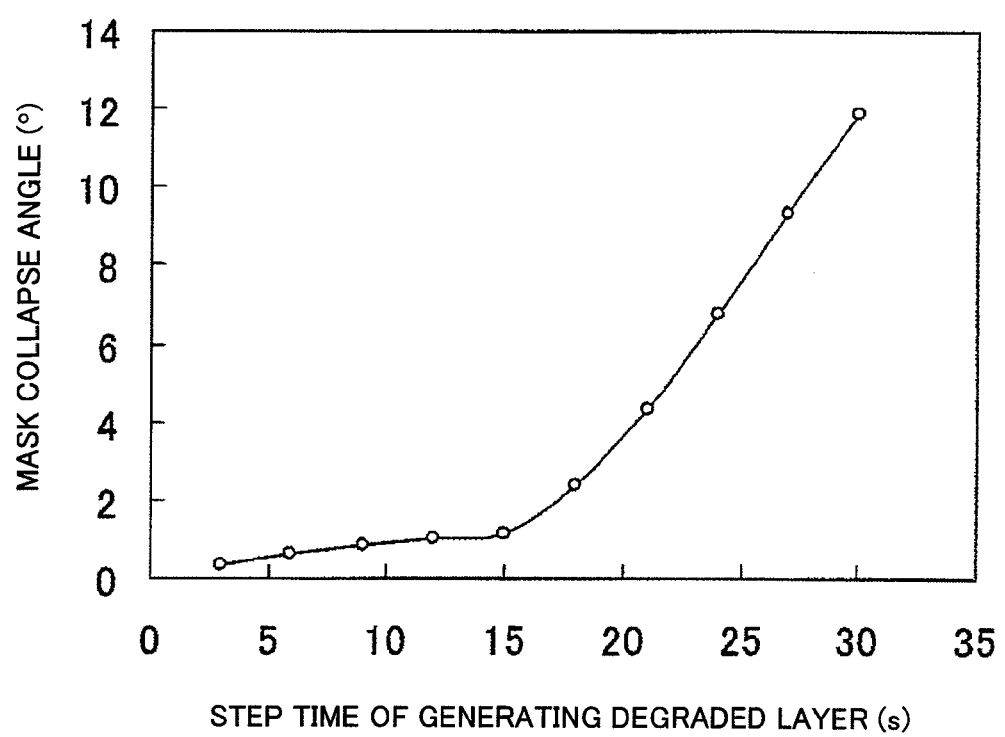
FIG. 1 illustrates a relation between a collapse angle after removing a degraded layer and time for a resist shrink process of 1 step.
Figure 2A:
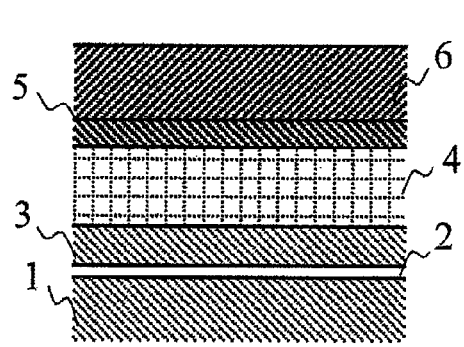
FIG. 2A illustrates a step of conventionally processing a gate electrode.
Figure 2B:
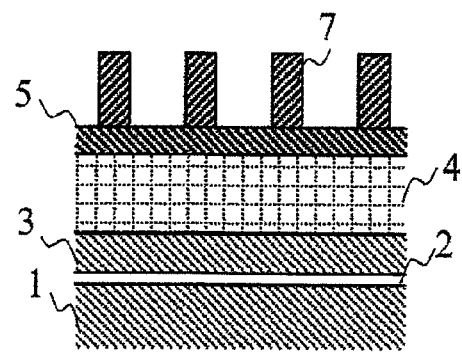
FIG. 2B illustrates another step of conventionally processing the gate electrode.
Figure 2C:
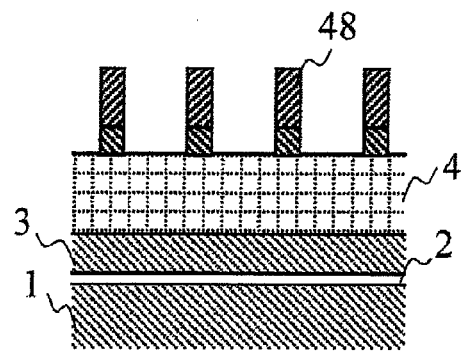
FIG. 2C illustrates still another step of conventionally processing the gate electrode.
Figure 2D:
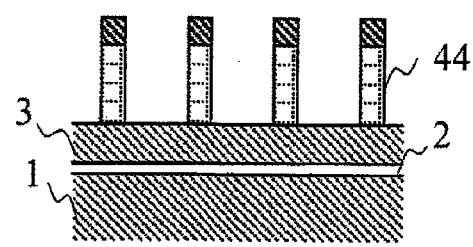
FIG. 2D illustrates still another step of conventionally processing the gate electrode.
Figure 2E:
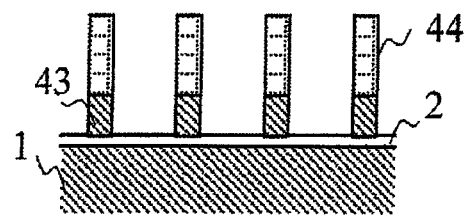
FIG. 2E illustrates still another step of conventionally processing the gate electrode.
Figure 3A:
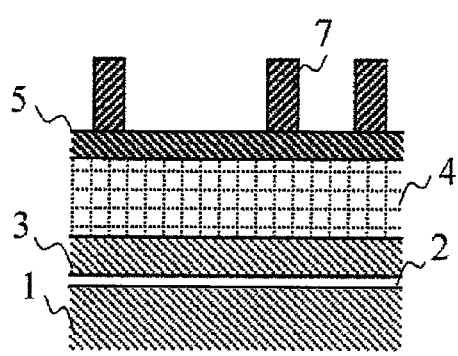
FIG. 3A illustrates a mechanism of a resist mask collapse in a sulfur-based passivation film.
Figure 3B:
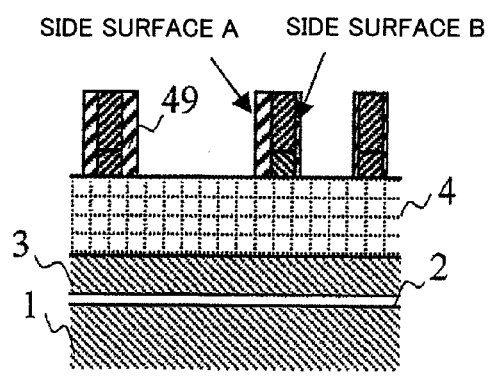
FIG. 3B illustrates a mechanism of a resist mask collapse in a sulfur-based passivation film.
Figure 3C:
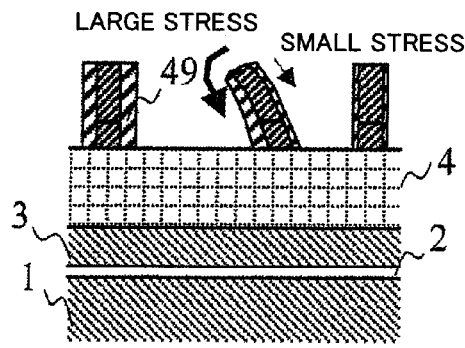
FIG. 3C illustrates a mechanism of a resist mask collapse in a sulfur-based passivation film.
Figure 4A:
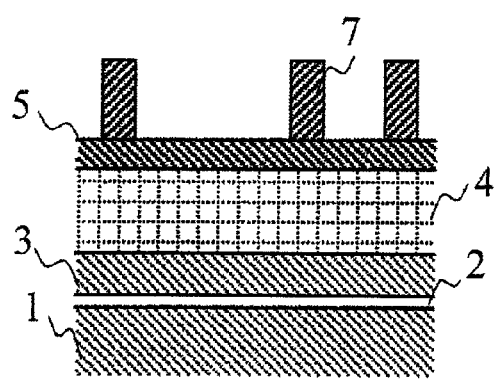
FIG. 4A illustrates a mechanism of a resist mask collapse in a degraded layer of a resist (in a most peripheral pattern)
Figure 4B:
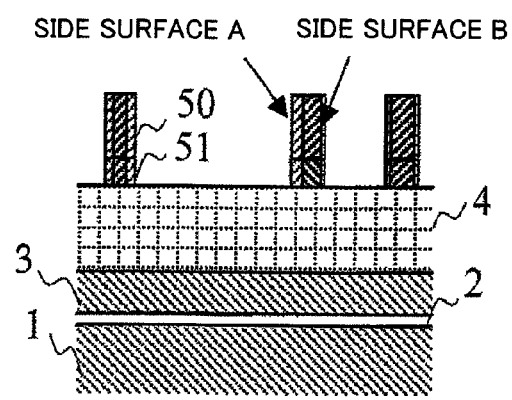
FIG. 4B illustrates a mechanism of a resist mask collapse in a degraded layer of a resist (in a most peripheral pattern)
Figure 4C:
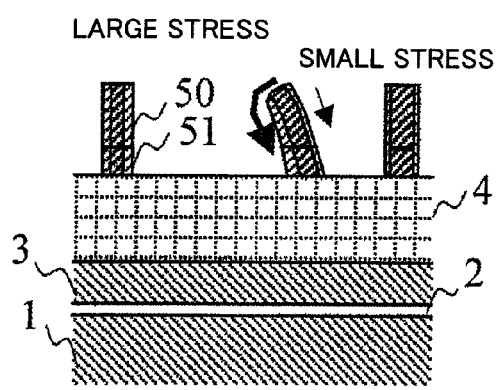
FIG. 4C illustrates a mechanism of a resist mask collapse in a degraded layer of a resist (in a most peripheral pattern)
Figure 5A:
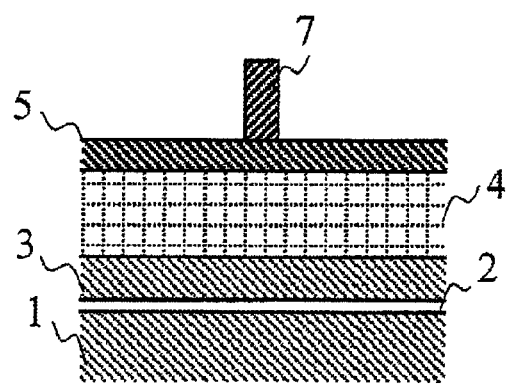
FIG. 5A illustrates a mechanism of a resist mask collapse in a degraded layer of a resist (in nonuniformity of radicals)
Figure 5B:
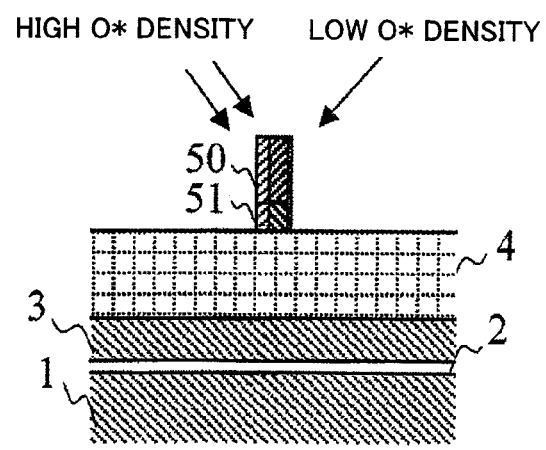
FIG. 5B illustrates a mechanism of a resist mask collapse in a degraded layer of a resist (in nonuniformity of radicals)
Figure 5C:
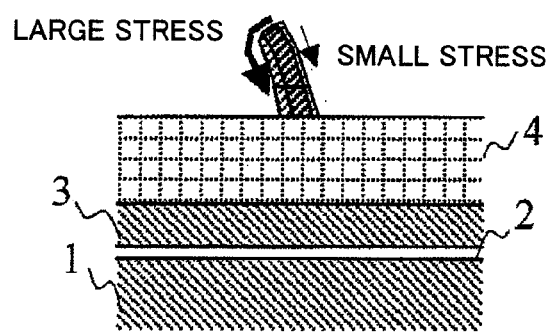
FIG. 5C illustrates a mechanism of a resist mask collapse in a degraded layer of a resist (in nonuniformity of radicals)
Figure 13:
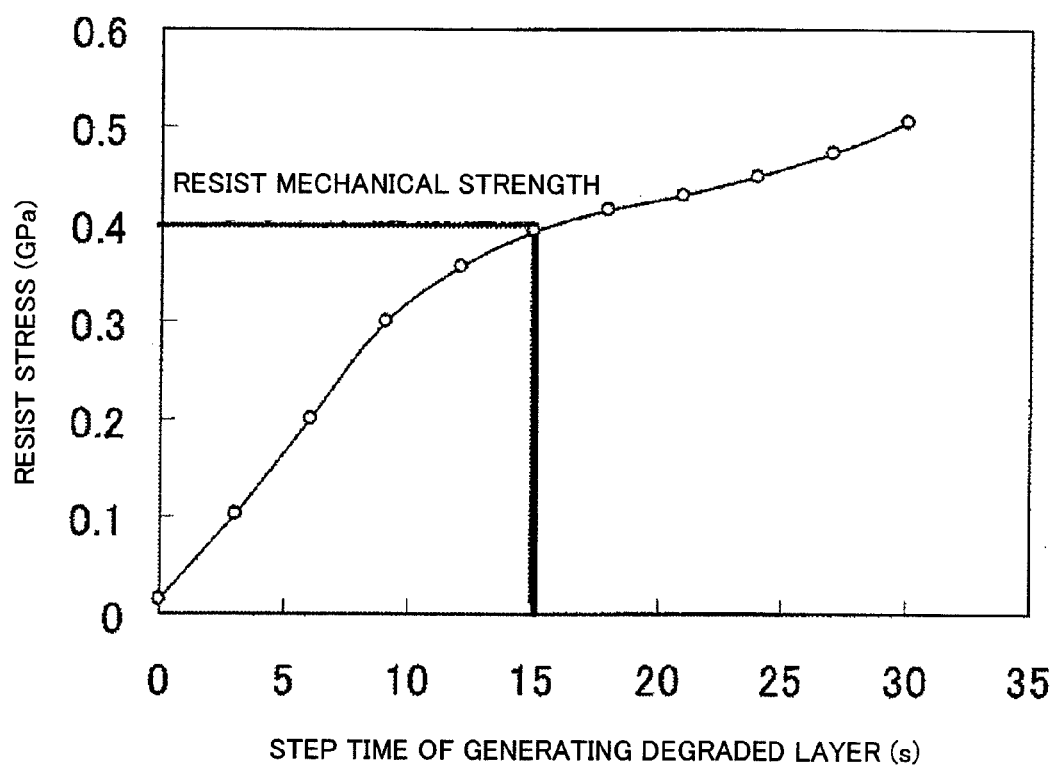
FIG. 13 illustrates a relation between a resist stress and time for a resist shrink process of 1 step.

In this case, the resist shapes right after the first shrink process, the first stress relax process, the second shrink process, and the second stress relax process are illustrated in FIGS. 12B, 12C, 12D, and 12E, respectively. It has been found out that, the resist is collapsed in the steps of the shrink processes and is returned to be vertical in the steps of the stress relax processes, and the collapse and the return are repeated, so that the resist is eventually maintained in an almost vertical shape. A relation between the time of 1 step for the $O_2$ process and the collapse angle of the resist mask after the stress relax is illustrated in FIG. 1. It has been found out that, when the step time for the $O_2$ process exceeds 15 seconds, the collapse angle of the mask is drastically increased. Also, a relation between the process time and a degree of the stress applied to the resist mask at this time is illustrated in FIG. 13. It has been found out that the stress applied to the resist mask is gradually increased as increasing the process time, and the stress exceeds the mechanical strength of the resist at about 15 seconds. That is, it has been found out that the resist shape can be returned to be vertical by performing the stress relax process prior to plastic deformation of the mask when the stress applied to the resist mask exceeds the mechanical strength of the material.

According to the studies by the inventors, it has been found out that the degree of the stress applied to the resist mask has a proportional relation as expressed by a formula 1. Therefore, when the miniaturization advances in the future to decrease a mask width "w" and a mask height "h", the stress applied to the resist mask is increased, and therefore, the step switching by a shorter time is required.

$$\sigma_{max} \propto t \times (2/h + 1/w + 1/s) \quad (1)$$

$\sigma_{max}$: maximum stress applied to the resist mask
t: process time
h: mask height
w: mask width According to a result described above, in order to shrink the resist mask without causing the mask collapse, it is required that, the shrink process and the stress relax process are alternately repeated, and the last step is finished with using the stress relax process, and further, the step for one shrink process is shortened.

The time for the one shrink process is 15 seconds or shorter in the 100 nm line and space, and the time is required to be shorter in the future when the dimension of the resist pattern becomes small. Also, when the resist dimension is extremely miniaturized with the time, the stress expressed by the formula 1 is gradually increased, and therefore, a process for shortening the step of the shrink process with the time is required.

Meanwhile, from a point of view of the gas switching, the gases cannot be stably switched for 2 seconds or shorter, and therefore, the step time of at least 2 seconds or longer is required. Also, as a result of the studies, it has been found out that, when the time of the one step for the shrink process is extremely shortened, a roughness on a side surface of the resist pattern is increased, and therefore, time of certain degree or longer is required as the time of the one step for the shrink process.

In the present embodiment, the shrink process of the resist mask is described. However, as far as the sample having the mask made of a resist or other organic material is processed with plasma under oxygen, fluorine, or nitrogen, the same effect is obtained even in etching, for example, a hardmask or a gate electrode. Also, in these processes, the $O_2$ gas diluted by Ar is used as the gas generating the degraded layer on the resist mask. However, any gas can be used as far as the gas contains any element of oxygen, fluorine, or nitrogen, and the same effect is obtained when, for example, $CO_2$, CO, $SF_6$, fluorocarbon gas of $C_xH_yF_z$, $N_2$, $NF_3$, or others is contained. Further, when a rare gas or other reactive gas is mixed with these gases, the same effect is also obtained under, for example, a mixture gas of Ar with $O_2$, $Cl_2$, and HBr, a mixture gas of Ar with $C_4F_8$, and $N_2$, or a mixture gas of $O_2$ with $N_2$.

In the present embodiment, Ar is used as the gas for the stress relax process. However, the same effect is also obtained under, for example, other rare gas of He, Ne, Kr, Xe, or others, or a mixture gas without containing any element of oxygen, fluorine, and nitrogen such as a mixture gas of Ar with $Cl_2$ and HBr.

In the present embodiment, the photoresist is used as the mask material. However, the same effect is also obtained by, for example, a carbon-content film formed by a plasma CVD method or coating method, an organic-based low-dielectric material, or others, even if the mask material is other organic material.

By using the processes according to the present embodiment, the vertical process is possible without causing the resist collapse even when right and left space distances are large as the most peripheral line and space pattern. Therefore, even in a location where a dummy pattern is conventionally required for reducing influences of dense and isolated patterns, the resist can be processed without the dummy pattern in the present embodiment, and therefore, an efficient design of a circuit pattern is possible.

Second Embodiment

In the equipment according to the first embodiment, on an input display of the computer 25 for the process conditions, input items of a width of the mask, a height of the same, and the mask material or the mechanical strength of the mask material are provided in addition to items of the conventional process conditions such as the step time, the gas flow, the pressure, and the microwave power as shown in Table 4. Based on these conditions, an optimum period of the stress relax process is automatically calculated from the relations described in the first embodiment, and a practical recipe (program) of periodically performing the stress relax process as shown in Table 5 is generated inside the computer and executed. In this manner, a user of the plasma process equipment can perform the process for less resist collapse without making a recipe having a complicated multi-stage steps.

What is claimed is:

1. A method of manufacturing a semiconductor device comprising steps of a plasma process performed on a semiconductor substrate having an insulating film and a mask formed on the insulating film and made of an organic material,
the plasma process comprising:
a first step of generating a stress to an organic material comprising a first photoresist film and an antireflection film so as to form a second photoresist film and a patterned antireflection film, said second photoresist film and patterned antireflection film having a second pattern shrinking the first pattern using a gas containing a rare gas without containing any of fluorine, oxygen, and nitrogen;
a second step of relaxing the stress from the second photoresist film and the patterned antireflection film using a gas containing a rare gas without containing any of fluorine, oxygen, and nitrogen; and
etching the insulating film using the second photoresist film and the patterned antireflection film as a mask, wherein the first step and the second step are alternately repeated, and wherein the first step is a performed for a time of 2 seconds or longer and 15 seconds or shorter.

2. The method of manufacturing the semiconductor device according to claim 1, wherein a last step of the plasma process is the second step.

3. The method of manufacturing the semiconductor device according to claim 1, wherein an aspect ratio (height/width) of the mask is 2 or larger, and a pattern dimension is 100 nm or smaller.

4. A method of manufacturing a semiconductor device comprising:

preparing a semiconductor substrate having an insulating film formed over the semiconductor substrate, an antireflection film made of an organic material and formed on the insulating film, and a first photoresist film having a first pattern on the antireflection film;

performing a first plasma step on the first photoresist film and the antireflection film so as to form a second photoresist film and a patterned antireflection film, said second photoresist film and patterned antireflection film having a second pattern shrinking the first pattern using a gas containing a rare gas without containing any of fluorine, oxygen, and nitrogen;

performing a second plasma step on the second photoresist film and the patterned antireflection film to relax the stress from the second photoresist film and the patterned antireflection film using a gas containing a rare gas without containing any of fluorine, oxygen, and nitrogen; and etching the insulating film using the second photoresist film and the patterned antireflection film as a mask, wherein the first plasma step is performed for a time of 2 seconds or longer and 15 seconds or shorter.

5. The method of manufacturing a semiconductor device according to claim 4, further comprising repeating the first plasma step and the second plasma step in order to pattern the insulating film.

6. The method of manufacturing a semiconductor device according to claim 4, wherein the second plasma step is a last step of a plasma process.

7. The method of manufacturing a semiconductor device according to claim 4, wherein an aspect ratio (height/width) of the mask is 2 or larger, and wherein a pattern dimension is 100 nm or smaller.

8. The method of manufacturing a semiconductor device according to claim 4, wherein said first plasma step and said second plasma step are performed in sequence so as to prevent deformation of said second photoresist organic film and said patterned antireflection organic film.

* * * * *